United States Patent [19]

Kira

[11] 4,190,786
[45] Feb. 26, 1980

[54] DISCHARGE LAMP

[75] Inventor: Takehiro Kira, Akashi, Japan

[73] Assignee: Ushio Denki Kabushikikaisha, Japan

[21] Appl. No.: 891,460

[22] Filed: Mar. 29, 1978

[30] Foreign Application Priority Data

Dec. 23, 1977 [JP] Japan .................. 52-153515

[51] Int. Cl.² .................. H01J 61/16; H01J 61/20; H01J 61/30
[52] U.S. Cl. .................. 313/184; 313/220; 313/225
[58] Field of Search .............. 313/225, 227, 220, 184

[56] References Cited

U.S. PATENT DOCUMENTS

| | | | |
|---|---|---|---|
| 2,707,247 | 4/1955 | Anderson, Jr., | 313/225 X |
| 2,896,107 | 7/1959 | Anderson, Jr. | 313/225 X |
| 2,990,490 | 6/1961 | Heine-Geldern | 313/184 X |
| 3,786,297 | 1/1974 | Zollweg et al. | 313/184 X |
| 4,038,578 | 7/1977 | Mathijssen | 313/220 X |

Primary Examiner—Palmer C. Demeo
Attorney, Agent, or Firm—Staas & Halsey

[57] ABSTRACT

A discharge lamp of the type which seals mercury and a rare gas in a bulb having sealed therein a pair of electrodes and in which both the mercury and the rare gas contribute to discharge radiation. Letting the value of the quantity of mercury (mg/cc.) sealed per 1 cc. of the volume of the bulb and the value of the (atmospheric) pressure of the rare gas be represented by X and Y, respectively, the values X and Y are selected to be in the ranges of $1 \leq X \leq 13$ and $2 \leq Y \leq 10$, respectively, whereby to abundantly emit ultraviolet rays of the wavelengths between 2000 to 2500 Å. The discharge lamp is employed as a light source for photolithography in the manufacture of semiconductor devices to achieve the formation of a fine pattern in a short time.

29 Claims, 1 Drawing Figure

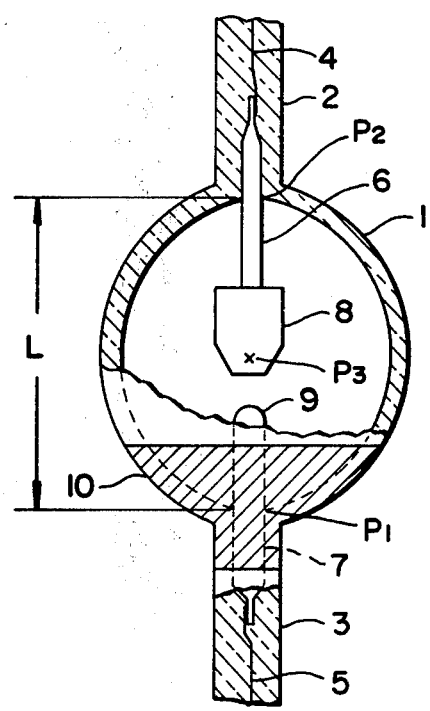

DISCHARGE LAMP

BACKGROUND OF THE INVENTION

1. Field of the Invention

This invention relates to a mercury-rare gas discharge lamp, and more particularly to a mercury-rare gas discharge lamp which is suitable for use in the printing or copying of patterns of ICs, LSIs and ultra LSIs.

2. Description of the Prior Art

The recent development of ultra LSIs requires printing or copying techniques with tolerances of less than 1 micron.

In the prior art, printing or copying techniques with tolerances of 1 micron or more are already in practice, employing a discharge lamp emitting ultraviolet rays of wave-lengths in the range of 3500 to 4500 A and a photoresist sensitive to the ultraviolet rays of these particular wave-lengths. But the prior art method cannot be used to achieve tolerances of less than 1 micron due to interference. For such tolerances electron beam lithography and X-ray lithography techniques have been studied and developed rapidly to take the place of the discharge lamp. These techniques, used in combination with a computer, permit of automation and simplification of the printing or copying process on one hand, but these have a fatal defect of requiring too much time for exposure on the other hand, and hence are said to be of little practical utility.

This led to a restudy of the combined use of a discharge lamp and a photo resist for utltraviolet rays to obtain a photoresist sensitive to ultraviolet rays having wave lengths less than 3000 A and a discharge lamp emitting such ultraviolet rays in large quantities.

Fortunately, it was ascertained by experiments in 1974 that a photoresist PMMA for use with electron beams could be sensitized by ultraviolet rays of wavelengths less than 2000 A (Applied Physics Letters, Vol. 25, page 451), and in 1975 that the photo resist PMMA could also be utilized for copying with rays of wavelengths between 2000 to 2600 A (J. Vac. Sci. Technol., Vol. 12, page 1317). As a result of this, the problem remaining to be solved is to obtain a discharge lamp which is capable of emitting a sufficient quantity of ultraviolet rays of wavelengths less than 3000 A.

SUMMARY OF THE INVENTION

Accordingly, a primary object of this invention is to provide a mercury-rare gas discharge lamp which emits a large quantity of ultraviolet rays of 2000 to 2500 A.

Another object of this invention is to provide a mercury-rare gas discharge lamp which is of particular utility when employed for the printing or copying of ultra LSI patterns.

The mercury-rare gas discharge lamp of this invention is characterized in that the relationship between the quantity of mercury and the pressure of a rare gas is defined to be in a particular range.

Mercury-rare gas discharge lamp have heretofore been known for some particular industrial applications, for instance as described in:

(a) Japanese Patent Publication No. 10,097/58 "Vapor Discharge Lamp"

(b) Japanese Patent Publication No. 32,955/75 "Mercury Pulse Discharge Lamp"

(c) U.S. Pat. No. 2,924,733, claim 4

However, these conventional discharge lamps have low intensity wavelengths in the range of 2000 to 2500 A and are of no utility for the printing or copying of ultra LSI patterns.

Besides, it is known that a superhigh-pressure mercury lamp, a xenon high-pressure discharge lamp and a heavy hydrogen lamp also emit ultraviolet rays in fairly large quantities. But they emit only a small quantity of rays at wave-lengths between 2000 and 2500 A, and requires several minutes for exposure in printing, and hence are not practical.

This invention is based on the findings that the most important wavelengths of ultraviolet rays for printing or copying is less than 2500 A and that specific quantitative ranges of the mercury and rare gas sealed together cause a marked increase in the quantity of rays emitted at wave-lengths between 2000 and 2500 A.

BRIEF DESCRIPTION OF THE DRAWING

The drawing is a side view, partly cut away, of the principal part of a discharge lamp produced in accordance with an embodiment of this invention.

DESCRIPTION OF THE PREFERRED EMBODIMENTS

The drawing is explanatory of a DC lighting, short arc type discharge lamp having sealed therein mercury and xenon gas. Reference numeral 1 indicates a substantially Rugby ball-shaped quartz bulb; 2 and 3 designate hermetic seals; 4 and 5 identify molybdenum foils embedded in the hermetic seals 2 and 3, respectively; and 6 and 7 denote inner leads extending into the quartz bulb 1 from the molybdenum foils 4 and 5, respectively, the inner lead 6 carrying an anode 8 at its tip and the tip 9 of the inner lead 7 functioning as a cathode. Reference character L represents the distance between the inner end $P_1$ of the quartz bulb 1 on the side of the cathode and the inner end $P_2$ on the side of the anode; and $P_3$ shows the center of the quartz bulb 1.

An example of the discharge lamp of the abovesaid structure, designed for obtaining data, is as follows:
Discharge lamp power dissipation: 500 W
Operating voltage: 24.2 V
Operating current: 20.6 A
Quantity (X) of mercury sealed per 1 cc. of the volume of the bulb: 6.8 mg/cc. (25° C.)
Xenon gas pressure (Y): 3 atm. (25° C.)
L: 39 mm
The following table shows the results of a comparison of the above discharge lamp of this invention with a DC lighting, short arc type superhigh-pressure mercury lamp (SH) and a xenon lamp (XL) now on the market (either of them having a rated power dissipation of 500 W).

|  | XL | SH | Discharge lamp of this invention |
|---|---|---|---|
| Quantity of ultraviolet rays of 2000 to 2500 Å | 1 | 0.1 | 10 |
| Printing time | 100 sec. | difficult printing | 15 sec. |

The above data for comparison are referenced from the quantity of rays of 2000 to 2500 Å emitted from the xenon lamp XL.

The above data indicate that the discharge lamp of this invention emits a fairly large quantity of ultraviolet rays at wavelengths in the range of 2000 to 2500 Å and takes much less time for printing, as compared with the other discharge lamps of the same power consumption as the discharge lamp of this invention.

The value X less than 1 causes an increase in the quantity of vacuum ultraviolet rays having wavelengths below 2000 Å and a decrease in the quantity of ultraviolet rays of the wavelengths ranging from 2000 to 2500 Å which are effective for printing. With the value X exceeding 13, the radiation of ultraviolet rays above 3000 Å increases and radiation of ultraviolet rays of 2000 to 2500 Å decreases, also resulting in lengthened printing time. The value Y less than 2 also suppresses the emission of the ultraviolet rays of 2000 to 2500 Å, while on the other hand the value Y more than 10 increases the emission of infrared rays, by which the part to be printed is heated to decrease accuracy of masking and hence result in lowered resolution.

As a result of our experiments, it has been found possible with $1 \leq X \leq 13$ and $2 \leq Y \leq 10$ to obtain a practical discharge lamp capable of generating a sufficiently large quantity of ultraviolet rays of 2000 to 2500 Å which shorten the printing time for the pattern formation and are effective for the formation of a fine pattern.

Incidentally, when the discharge lamp of the above embodiment is used for the printing operation, it is incorporated in an exposure device such, for example, as disclosed in Japanese Utility Model Publication No., 22,617/75. In view of the adaptability for the exposure device, (a) it is preferred that the tip of the anode be extended towards the cathode from the center $P_3$ of the quartz bulb and that it be positioned within the volume between the center $P_3$ and a point spaced from the center $P_3$ a distance 1/6 of the aforesaid distance L between the inner ends of the quartz bulb, and (b) a reflection film 10 is formed on that part of the bulb surrounding the cathode side. This facilitates evaporation of mercury and decreases stray light. It is preferred that the reflection film be provided to cover the entire area of the bulb from the inner end $P_1$ of the cathode side to a point of distance L/6 therefrom.

In the drawing, the reflection film 10 is shown to partly extend to the hermetic seal 3, which is further effective for the suppression of stray light.

The discharge lamp of the above described invention emits a large quantity of ultraviolet rays of wavelengths ranging from 2000 to 2500 Å and ensures the obtaining of tolerances of less than 1 micron in printing or copying of IC, LSI and ultra LSI patterns and for achieving the printing or copying operation in a very short time. Accordingly, the discharge lamp of this invention is of great utility.

In addition, the DC lighting, short arc type discharge lamp of the above embodiment has properties intermediate between a high-pressure gas discharge lamp and a high-pressure mercury one and this requires some changes in the design of the anode, for example, By various experiments, it has been found in the case of the DC lighting, short arc type discharge lamp that, the volume of the anode 8 is preferred to be in the range of $0.5 \times 10^{31\ 3}$ to $1.5 \times 10^{-3}$ cc./W in terms of power dissipation of the discharge lamp.

Further, the xenon gas may be replaced with other rare gases, although they are somewhat inferior in radiation efficiency. Also in the case of an AC lighting, long arc type discharge lamp, it is possible to obtain a mercury-rare gas discharge lamp which emits ultraviolet rays of 2000 to 2500 Å in large quantity.

It will be apparent that many modifications and variations may be effected without departing from the scope of the novel concepts of this invention.

What is claimed is:

1. A source of ultraviolet radiation comprising:
    a sealed bulb, at least a portion of said bulb being transmitting to wavelengths below 3000 angstroms,
    a pair of electrodes sealed in said bulb,
    mercury sealed within said bulb in amount from 1 to 13 mg. per cc. of volume of said bulb, and
    at least one rare gas sealed within said bulb at a pressure from 2 to 10 atm. at 25° C.

2. The source of claim 1, said portion of said bulb transmitting between 2000 and 2500 angstroms.

3. The source of claim 1, said electrodes comprising an anode and a cathode for operating said source with DC voltage.

4. The source of claim 3, said bulb having length L in a vertical direction, said anode and cathode being aligned vertically from above and below, respectively, and said anode being located between the center of said bulb and a distance L/6 below said center.

5. The source of claim 1 or 4, wherein said amounts of mercury and rare gas are adjusted to maximize the emission of said ultraviolet radiation between 2000 and 2500 angstroms.

6. The source of claim 1 or 4, said at least one rare gas comprising xenon.

7. The source of claim 4, said anode comprising a volume in the range from $0.5 \times 10^{-3}$ to $1.5 \times 10^{-3}$ cc. per watt of rated power dissipation of said source.

8. The source of claim 7 comprising means for operating said bulb for exposing photoresist in practical exposure periods of considerably less than 100 sec., said at least one rare gas comprising xenon, and said at least one portion of said bulb transmitting between 2000 and 2500 angstroms.

9. The source of claim 4 comprising a reflective coating on the inside of said bulb from the bottom of said bulb to a distance L/6 from said bottom in said vertical direction.

10. The source of claim 3, said anode and cathode being selectively spaced to comprise a lamp chosen from the group consisting of short and long arc lamps.

11. A method for producing ultraviolet radiation below 3000 angstroms comprising:
    providing a lamp having a bulb that transmits said ultraviolet radiation, a pair of electrodes sealed in said bulb, and mercury in amount from 1 to 13 mg. per cc. of bulb volume and at least one rare gas at a pressure from 2 to 10 atm. at 25° C. sealed in said bulb, and
    operating said lamp by applying a voltage across said electrodes sufficient to produce said ultraviolet radiation.

12. The method of claim 11, said bulb transmitting said ultraviolet radiation between 2000 and 2500 angstroms.

13. The method of claim 11, said pair of electrodes comprising an anode and a cathode for operating said lamp with DC voltage.

14. The method of claim 13, said bulb having length L in a vertical direction, said anode and cathode being aligned vertically from above and below, respectively, and said anode being located between the center of said bulb and a distance L/6 below said center.

15. The method of claim 11, comprising adjusting said amounts of mercury and rare gas to maximize the emission of said ultraviolet radiation between 2000 and 2500 angstroms.

16. The method of claim 11 or 14, said at lease one rare gas comprising xenon.

17. The method of claim 13, said anode comprising a volume in the range from $0.5 \times 10^{-3}$ to $1.5 \times 10^{-3}$ cc. per watt of rated power dissipation of said lamp.

18. The method of claim 14, said lamp comprising a reflective coating on the inside of said bulb from the bottom of said bulb to a distance in said vertical direction of L/6 from said bottom.

19. The method of claim 13, said anode and cathode being selectively spaced to comprise a lamp chosen from the group consisting of short and long arc lamps.

20. An improved source of ultraviolet radiation, said source comprising a sealed bulb transmitting wavelengths as low as 2000 angstroms and a pair of electrodes sealed in said bulb, said improvement comprising
 mercury sealed in said bulb in amount from 1 to 13 mg. per cc. of said bulb volume, and
 at least one rare gas sealed within said bulb at a pressure from 2 to 10 atm. at 25° C.

21. The improved source of claim 20, said bulb transmitting between 2000 and 3000 angstroms.

22. The improved source of claim 21, said pair of electrodes comprising an anode and a cathode, and said lamp being operated with DC voltage.

23. The improved source of claim 22, said improvement comprising said bulb having length L in a vertical direction, said anode and cathode being aligned vertically from above and below, respectively, and said anode being located between the center of said bulb and a distance L/6 below said center.

24. The improved source of claim 21, said improvement comprising adjusting said mercury and rare gas(es) to maximize said ultraviolet radiation between 2000 and 2500 angstroms.

25. The improved source of claim 20, said improvement comprising said at least one rare gas comprising xenon.

26. The improved source of claim 22, said improvement comprising a volume in the range from $0.5 \times 10^{-3}$ to $1.5 \times 10^{-3}$ cc. per watt of rated power dissipation of said source.

27. The improved source of claim 23, said improvement comprising a reflective coating on the inside of said bulb from the bottom of said bulb to a distance L/6 from said bottom in said vertical direction.

28. The improved source of claim 22, said anode and cathode being selectively spaced to comprise a lamp chosen from the group consisting of short and long arc lamps.

29. The improved source of claim 20 or 26, said sealed bulb, electrodes, mercury and at least one rare gas providing said transmitted wavelengths with sufficient intensity for exposing photoresist in practical exposure times of considerably less than 100 sec.

* * * * *

UNITED STATES PATENT AND TRADEMARK OFFICE
CERTIFICATE OF CORRECTION

PATENT NO. : 4,190,786
DATED : February 26, 1980
INVENTOR(S) : Takehiro Kira

It is certified that error appears in the above-identified patent and that said Letters Patent are hereby corrected as shown below:

Column 1, line 17, "wave-lengths" should be --wavelengths--.

Column 1, line 17, "A" should be --$\overset{\circ}{A}$--.

Column 1, line 19, "wave-lengths" should be --wavelengths--.

Column 1, line 30, "photo resist" should be --photoresist--.

Column 1, line 33, "A" should be --$\overset{\circ}{A}$--.

Column 1, line 38, "A" should be --$\overset{\circ}{A}$--.

Column 1, line 41, "A" should be --$\overset{\circ}{A}$--.

Column 1, line 45, "A" should be --$\overset{\circ}{A}$--.

Column 1, line 50, "A" should be --$\overset{\circ}{A}$--.

Column 2, line 1, "A" should be --$\overset{\circ}{A}$--.

Column 2, line 7, "wave-lengths" should be --wavelengths--.

Column 2, line 5, "A" should be --$\overset{\circ}{A}$--.

Column 2, line 12, "A" should be --$\overset{\circ}{A}$--.

Column 2, line 15, "wave-lengths" should be --wavelengths--.

Column 2, line 15, "A" should be --$\overset{\circ}{A}$--.

Column 3, line 57, ", By" should be --. By--.

UNITED STATES PATENT AND TRADEMARK OFFICE
CERTIFICATE OF CORRECTION

PATENT NO. : 4,190,786
DATED : February 26, 1980
INVENTOR(S) : Takehiro Kira

It is certified that error appears in the above-identified patent and that said Letters Patent are hereby corrected as shown below:

Column 5, line 3, "lease" should be --least--.*

Signed and Sealed this

First Day of July 1980

[SEAL]

Attest:

SIDNEY A. DIAMOND

Attesting Officer

Commissioner of Patents and Trademarks